US005570950A

United States Patent [19]
Griffin

[11] Patent Number: 5,570,950
[45] Date of Patent: Nov. 5, 1996

[54] LIGHTING FIXTURE AND METHOD OF FABRICATION

[75] Inventor: Alan R. Griffin, Camarillo, Calif.

[73] Assignee: Thin-Lite Corporation, Camarillo, Calif.

[21] Appl. No.: 383,993

[22] Filed: Feb. 6, 1995

[51] Int. Cl.$^6$ .................................................. H05K 7/20
[52] U.S. Cl. .......................... 362/221; 361/674; 361/711; 361/714; 445/23
[58] Field of Search .............................. 257/718; 445/23; 29/525.2; 362/221, 260; 174/52.1, 61; 361/674, 709, 710, 711, 714

[56] References Cited

U.S. PATENT DOCUMENTS

| | | |
|---|---|---|
| 2,099,020 | 11/1937 | La Ducer . |
| 2,347,174 | 9/1943 | Cross et al. . |
| 2,702,378 | 2/1955 | Talty .................................... 362/221 X |
| 3,136,489 | 1/1962 | Oharenko . |
| 3,283,114 | 11/1966 | Rogers ..................................... 362/221 |
| 3,947,678 | 3/1976 | Herbert Tang . |
| 4,523,219 | 6/1985 | Heidegger et al. ...................... 257/726 |
| 4,698,733 | 10/1987 | Griffin . |
| 4,994,943 | 2/1991 | Aspenwall . |
| 5,171,085 | 12/1992 | Jaksich . |
| 5,197,797 | 3/1993 | Jaksich . |
| 5,383,092 | 1/1995 | Liberati ................................... 361/713 |
| 5,396,404 | 3/1995 | Murphy et al. .......................... 361/710 |

Primary Examiner—Kenneth J. Ramsey
Attorney, Agent, or Firm—Fulwider Patton Lee & Utecht

[57] ABSTRACT

A fluorescent tube lighting fixture and method of fabrication characterized by the selection of a common channel housing including a central mounting bore wherein either a first circuit board device, including a single transistor mounting foot, or a second circuit board device, including two laterally spaced apart transistor mounting feet, may be selected for mounting to the common channel housing. To mount the first circuit board device to the channel housing, the first circuit board device is positioned on the channel housing and a fastener is inserted through a fastener bore of the single transistor mounting foot and mounting bore of the channel housing. To mount the second circuit board device to the channel housing, the second circuit board device is positioned on the channel housing and a mounting clip formed with a through bore is positioned in overlying relationship over the pair of mounting feet wherein a fastener may be inserted through the through bore, through a clearance slot between the pair of mounting feet, and through the mounting bore of the channel housing.

7 Claims, 2 Drawing Sheets

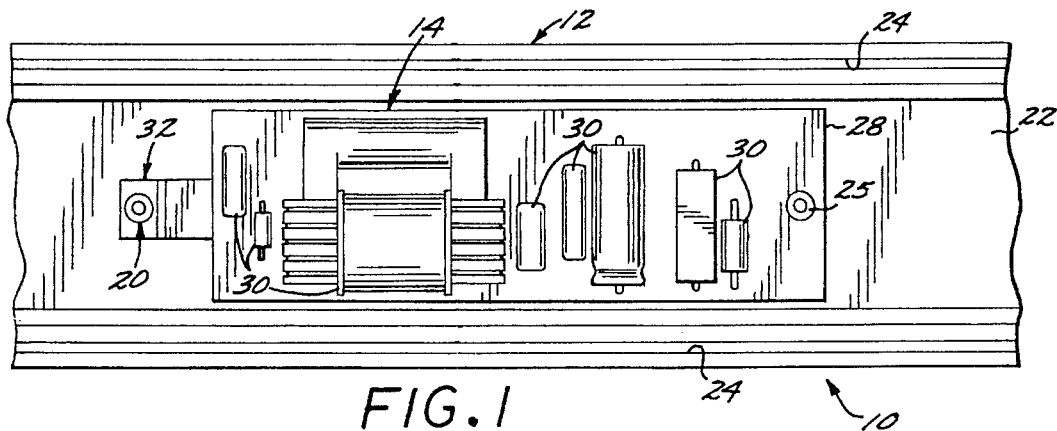
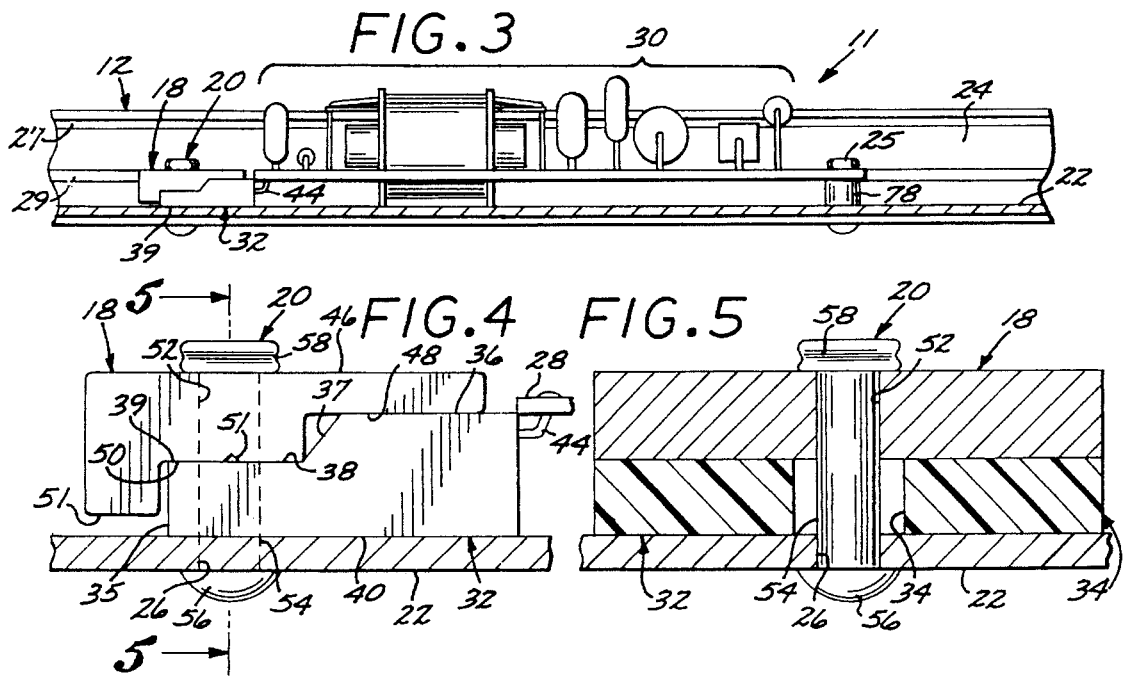
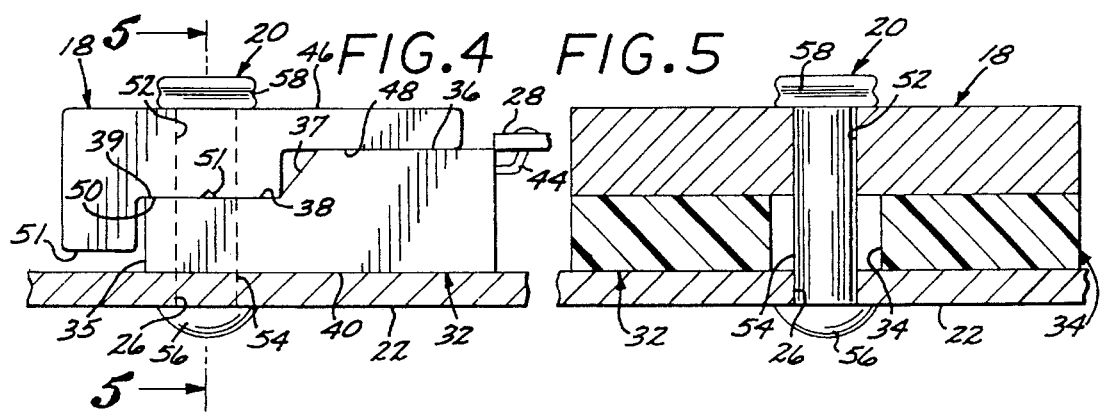
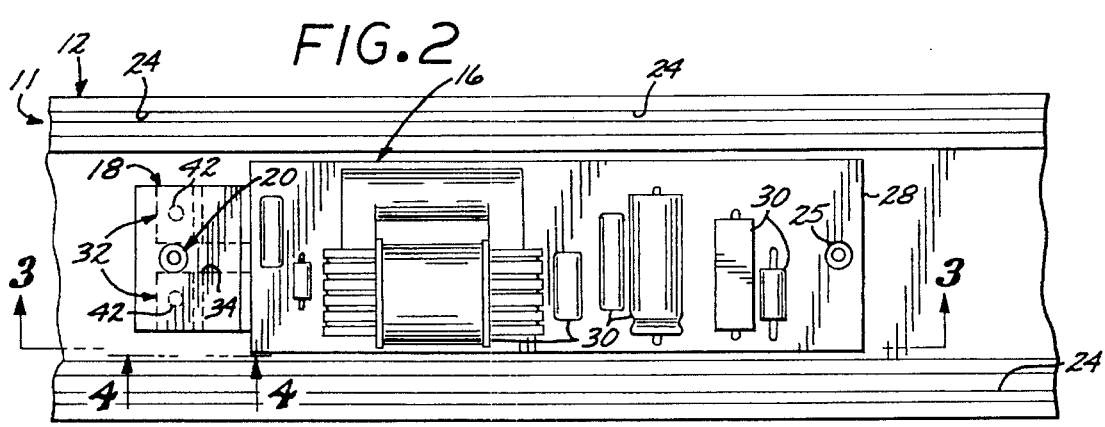

LIGHTING FIXTURE AND METHOD OF FABRICATION

BACKGROUND OF THE INVENTION

1. Field of the Invention

The subject invention relates to fluorescent tube lighting fixtures for installation in vehicles having direct current electrical systems.

2. Description of the Prior Art

Florescent lighting fixtures including fluorescent light tubes are commonly mounted within the cabins of recreational vehicles, tractor trailers, and small marine vessels to illuminate the interiors thereof. Because these fixtures may be operated when the vehicle's engine is not running, fluorescent lighting fixtures, rather that incandescent lighting fixtures, are desirable due to their relatively low power consumption that minimizes drain on the vehicle's battery.

Fluorescent lighting fixtures typically incorporate circuit board devices having electrical components including single or multiple power transistors mounted on a printed circuit board. Because most recreational vehicles have direct current (DC) electrical systems, the lighting fixture must be configured for use with DC power. The electrical components receive electrical power from the DC power source and convert such DC signal to an oscillating output signal. The output signal is oscillated at a selected frequency for energizing the fluorescent light tube of the fixture. A ballast circuit is also provided which serves to regulate and limit current through the fluorescent tube.

In single power transistor applications, the output signal from the transistor may provide a square wave form that inherently includes a level of harmonic distortion or noise. When such a transistor is incorporated in a lighting fixture mounted within a recreational vehicle and connected to the DC electrical system thereof, such noise may undesirably interfere with other electrical accessories in the vehicle such as the AM radio, citizen's band radio, or the radio navigation system of marine vessels.

To eliminate or to lower the amount of noise distortion to at least acceptable levels, a second transistor may be included in the electronics of the lighting fixture and configured in combination with the first transistor to provide a "push-pull" circuit. The "push-pull" circuit provides an output sine wave signal that provides much less noise distortion. Thus, a lighting fixture having the "push pull" circuit may be selected for certain low noise distortion applications. Furthermore, the additional second transistor may provide greater power output for use with higher wattage fluorescent light tubes and or multiple tube fixtures. Although these low distortion fixtures are more expensive, consumers desire to purchase the lower noise distortion lighting fixtures to eliminate interference with other vehicle accessories.

In the factory setting, preassembled circuit board devices are separately manufactured to provide the particular electrical power configuration, be it a single transistor or a double "push-pull" transistor configuration for subsequent mounting within the housings of particular lighting fixtures. The circuit board devices are typically of a standard size configured for common mounting orientations within the fixture housings to facilitate high volume assembly.

Inherently, power transistors generate a large amount of heat, and thus are typically integrally housed in a heat sink or heat dissipative package. In some devices, the transistor package may be itself configured to fixedly mount the circuit board to the fixture housing. This is accomplished by molding the transistor package in the form of a mounting foot. In the single transistor configuration, a single transistor mounting foot may be mounted to the circuit board to project outwardly therefrom. The mounting foot may be provided with a mounting bore for alignment with a mounting hole in the fixture housing such that a rivet may be fastened therethrough. As such, the rivet engages the mounting foot to secure the mounting foot directly to the fixture housing. In such a configuration, heat is transferred through the mounting foot to the fixture housing to more effectively dissipate heat generated from the transistor.

The "push-pull" type circuit board devices may include a pair of identical mounting feet, each mounting foot integrally formed with a transistor therein. The pair of transistor mounting feet may be disposed at one end of the circuit board in a predetermined laterally spaced apart configuration. Thus, a second fixture housing may have to be provided formed with two spaced apart mounting holes therethrough for receiving a pair of fastening rivets to secure the respective mounting feet to the fixture housing.

In the production environment, lighting manufacturers typically manufacture a multitude of fluorescent lighting fixture housings of different styles having different widths and lengths to house a variety of different size fluorescent light tubes. Furthermore, the fixture housings may be configured to house one or a multitude of fluorescent light tubes. As such, many lighting fixture manufacturers may have upwards of a hundred or more different types of fixture housings in inventory.

Lighting manufacturers typically have high-volume automated tooling fixtures and jigs set-up in the factory to manufacture such a variety of fixture housings and lighting fixtures. However, such equipment may only be set-up to produce fixture housings having a mounting configuration for either the single power transistor-type circuit board or the "push-pull" -type circuit board. For instance, the production line may be set up with fixturing for mounting a circuit board device having only the single transistor configuration. To procure additional equipment and re-tool the factory to supply a second fixture housing for mounting the alternative "push-pull" circuit board device, the manufacturer may expend many thousands of dollars. In addition, many days or weeks of downtime may be incurred in retrofitting the existing equipment with the necessary fixtures to manufacture a second series of fixture housings. Furthermore, providing a second series of fixture housings increases manufacturing costs and doubles inventory.

Therefore, it is desirable to provide a fluorescent tube lighting fixture wherein at least two differently configured pre-assembled circuit boards including either one or two integrally formed transistor mounting feet may be mounted to a single common fixture housing. As such, tooling time and manufacturing expenses necessary to fabricate two differently configured fixture housings may be eliminated. In addition, inventory and the expenses associated therewith are minimized.

SUMMARY OF THE INVENTION

The present invention provides for the fabrication of first and second fluorescent tube lighting fixtures characterized by the selection of a common channel housing, selection of either a first circuit board device or a second circuit board device, selection of a mounting clip for use with the second circuit board device, and the selection of a fastener to operatively affix either circuit board device to the channel housing.

The common channel housing is formed with a planar back wall and includes a central mounting bore. The first circuit board device includes a single mounting foot integrally formed with a transistor therein. The foot projects outwardly from one end of the circuit board device and is formed with a fastener bore therethrough. The second circuit board device includes two laterally spaced apart mounting feet each including a transistor integrally formed therein, the respective feet projecting from one end of the circuit board to define therebetween a clearance slot.

The mounting clip is configured with a hold down plate formed to complementally fit over the pair of mounting feet of the second circuit board device. The hold down plate is formed with a through bore for alignment with the clearance slot of the second circuit board device.

The first circuit board device may be selected and positioned on the common channel housing to align the fastener bore of the single transistor foot over the mounting bore of the housing for receipt of a fastener rivet therethrough.

Alternatively, the second circuit board device may be selected and positioned on the common channel housing such that the clearance slot, between the pair of transistor feet, overlies the mounting bore of the housing. In that combination, the mounting clip will be positioned to overlie the second circuit board device such that the hold down plate of the clip overlies both transistor feet thereof with the through bore of the hold down plate aligned over the clearance slot and the mounting bore of the housing for receipt of a fastener rivet therethrough.

Other features and advantages of the invention will become apparent from the following detailed description, taken in conjunction with the accompanying drawings which illustrate, by way of example, the features of the invention.

BRIEF DESCRIPTION OF THE DRAWINGS

FIG. 1 is a partial top plan view of a first fluorescent tube lighting fixture mounting a first circuit board device including a single integrally formed transistor mounting foot mounted to a common channel housing;

FIG. 2 is a partial top plan view of a second fluorescent tube lighting fixture of the invention similar to that shown in FIG. 1, but showing a mounting clip securely mounting a second circuit board device including a pair of integrally formed transistor mounting feet to the common channel housing;

FIG. 3 is a partial longitudinal sectional side view of the lighting fixture taken along the line 3—3 of FIG. 2;

FIG. 4 is a partial sectional view, in enlarged scale taken along the line 4—4 of FIG. 2;

FIG. 5 is a vertical sectional view taken along line 5—5 of FIG. 4; and

DETAILED DESCRIPTION OF THE PREFERRED EMBODIMENT

Figure 6:
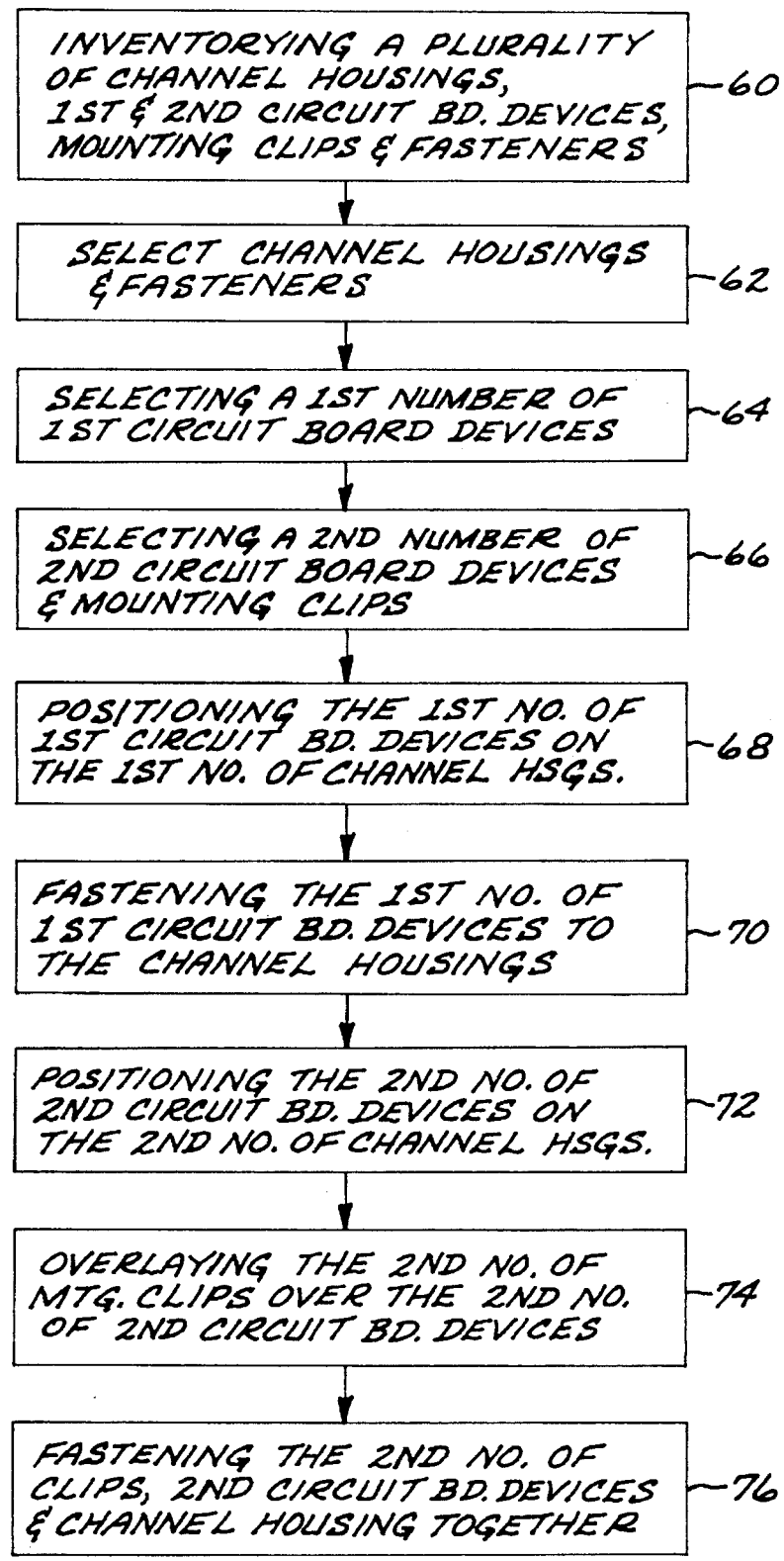
FIG. 6 is a schematic diagram of the steps of the method for fabricating the first and second fluorescent tube lighting fixtures shown in FIGS. 1 and 2.

In the following detailed description, like reference numerals will be used to refer to like or corresponding elements in the different figures of the drawings. Referring now to the drawings and particularly to FIGS. 1 and 2, the present invention is directed to first and second fluorescent tube lighting fixtures 10 and 11 and their method of fabrication. In general, each fixture includes an elongated common or standardized channel housing 12 having a standard predetermined mounting hole configuration. The first lighting fixture 10 mounts a selected first circuit board device 14 (FIG. 1) to the channel housing using a standard fastener. The second lighting fixture 11 mounts a second circuit board device 16 (FIG. 2) having a different configuration than the first circuit board device. In the second lighting fixture, a mounting clip 18 is configured and sized to cooperate with the predetermined mounting hole configuration of the channel housing such that the standard fastener securely affixes the second circuit board device to the common channel housing. As such, a second channel housing with a second mounting hole configuration does not have to be provided, thus minimizing manufacturing and inventory costs associated therewith. In addition, tooling costs and additional equipment necessary to manufacture two different customized models may be eliminated.

With reference to FIGS. 1 and 2, the common channel housing 12 is an elongated extruded metal channel formed with a back wall 22 having a planar front surface. Extending upwardly from the back wall are a pair of coextensive laterally disposed side walls 24. The back wall of the channel housing is formed with a centrally located, axially spaced apart first mounting bore 26 and second mounting bore for receiving respective first and second fastener rivets 20 and 25. The channel housing 12 is constructed from a standard extrusion to form an elongated pocket to mount therein one or a multitude of elongated fluorescent light tubes (not shown). The multitude of elongated fluorescent light tubes may be arranged either in an end-to-end or side-by-side relationship depending on the particular application.

Referring now to FIG. 3, the respective side walls 24 of the channel housing 12 may be extruded to form longitudinal upper and lower grooves 27 and 29. The respective lower grooves 27 are in confronting relationship configured to receive the lateral marginal edges of a wireway cover (not shown) to protectively cover the electrical components 30. A fluorescent light tube or tubes (not shown) would be disposed over the wireway cover and the electrical connectors at the longitudinal opposite ends of the light tube would be received in electrical receptacle sockets mounted at the opposite ends of the channel housing. The respective upper grooves 29 are formed in confronting relationship configured to receive the lateral marginal edges of a translucent lens cover (not shown) to enclose the channel housing and light tubes when the fixture is finally assembled.

With continued reference to FIGS. 1 and 2, the first and second circuit board devices, 14 and 16, have many similar components. Both circuit board devices include a thin printed circuit board 28 that provides a support surface to mount various conventional electrical components 30 thereon and to provide electrical pathways therebetween. Each circuit board is generally rectangular and is relatively narrow in lateral width such that it may be received in the pocket between the side walls 24 of the channel housing 12. The electrical components are selected to power the lighting fixture from a DC power source as would be present in a conventional recreational vehicle or the like. The electrical components form an electrical circuit to produce the desired oscillating current at a desired frequency to energize the one or more fluorescent light tubes as the case may be. The electrical components further incorporate a ballast circuit that limits and regulates the amount of current through the fluorescent tube or tubes when energized.

The electrical components 30 of the first circuit board device 14 incorporates a single power transistor in circuit therewith to provide the requisite power for a selected wattage fluorescent tube or tubes. Inherently the single transistor, when driven above a certain threshold, may provide a square output wave form that has harmonic distortion or noise. This noise distortion is undesirable in some applications, as the signal may interfere with other electrical accessories in the vehicle, such as the AM radio. In view of this phenomena, a second transistor may be configured in combination with the first transistor to provide a "push-pull" circuit that provides a smooth output sine wave signal. The smooth sine wave signal may eliminate or at least minimize the amount of noise distortion otherwise present in single transistor circuit devices. Thus, the second circuit board device including "push-pull" transistor circuitry may be selected for low noise distortion applications. Furthermore, the two-transistor configuration, may be used in applications where more power is required, such as with higher watt fluorescent tubes and multiple tube fixtures.

Because transistors, when in operation, tend to develop significant heat, they may be integrally formed in heat dissipative packages. In lighting fixtures, the transistors may be integrally formed in a heat dissipative packages configured to contact the channel housing 12. As such, the heat dissipative packages may engage the channel housing in a heat exchange relationship to transfer heat away from the transistor. By providing intimate contact between the transistor heat dissipative package and the channel housing, the coefficient of heat transfer is enhanced. Thus, transistor heat dissipative packages have been configured to provide for mechanical fastening between the circuit board device and the channel housing directly through the heat dissipative package.

With reference to FIG. 1, the first circuit board device 14 includes the single transistor configuration. As shown, the transistor is integrally formed in a heat dissipative package molded in the form of a rectangular mounting foot 32. The single transistor mounting foot 32 is attached centrally to one end of the circuit board 28 and projects longitudinally outwardly therefrom. With reference to FIG. 2, the second circuit board device 16 incorporates the "push-pull" transistor circuit that includes a pair of transistors incorporated in respective mounting feet 32 (shown in phantom), projecting from one end of the circuit board. The pair of mounting feet project longitudinally outwardly from the circuit board and are laterally spaced apart in flanking relationship to define a central clearance slot 34 therebetween.

Referring now to FIG. 4, the configuration of each mounting foot 32 is identical, each being configured with a proximal body having a rectangular flat top surface 36 which tapers downwardly and outwardly along a transition 37 to a distal tab 39 having a flat rectangular distal top surface 38. The tab terminates in a squared off distal end 35. The bottom of the mounting foot is formed with a flat planar bottom surface 40 for engaging, in direct intimate contact, the flat planar front surface of the back wall 22 of the channel housing 12. This direct engagement provides for efficient heat transfer therebetween. A fastener bore 42 (FIG. 2) is formed through each mounting foot at generally the center of the top surface 38 of the tab 39, the fastener bore sized for receipt of the first fastener rivet 20 therein (FIG. 1) when used with the first circuit board device 14. A plurality of side-by-side rigid conductive wires 44 (FIG. 3) extend outwardly and upwardly from the proximal end of the mounting foot 32 and are embedded in the body of the circuit board to rigidly secure the mounting foot 32 to the circuit board 28 while providing electrical continuity. The mounting feet 32 are composed of a ceramic based composition having a high coefficient of heat transfer that provides for rapid heat transfer from the transistor.

In the preferred embodiment, the mounting clip 18 is composed of extruded thermally conductive metal, such as aluminum. With continued reference to FIG. 4, the mounting clip 18 is generally rectangular having a stepped lower surface configured for complementary engagement over both proximal and distal segments of the pair of respective mounting feet 32 of the second circuit board device 16. In particular, the mounting clip is of a generally L-shaped construction to define a stepped hold down. The mounting clip is constructed with a hold down plate 50 for overlying the top surfaces 38 of the respective tabs 39 of the respective mounting feet and then project proximally to form a flat horizontal flange 48 overlying the top surfaces 36 of the respective bodies of the transistor mounting feet. The clip is formed at its distal end with a down turned retainer lip 51 sized and configured to complementally overlie the distal ends 35 of the respective mounting feet. The mounting clip is formed on the bottom side of the hold down plate 50 with a lateral groove 51 for machining alignment. A through bore 52 is formed through the mounting clip and centrally through the hold down plate.

Referring to FIG. 5 the fastener 20 is preferably a conventional rivet-type device having a shaft 54 and an enlarged bottom head 56. The top end of the shaft may be malleable so that end may be deformably impacted to form an expanded head 58. The shaft of the fastener is sized for receipt within the fastener bore 42 of the mounting foot 32 and sized for receipt within the mounting bore 26 of the channel housing 12. In addition, the shaft of the fastener is sized for receipt within the through bore 52 of the mounting clip 18 and sized for receipt within in the clearance slot 34 between the pair of mounting feet 32 of the second circuit board device. A rivet has been found preferable as a fastening device because of its relative low cost and speed at which it may be engaged.

It is anticipated that both the first and second lighting fixtures 10 and 11 will be manufactured on the same assembly line wherein speed and productivity are important. With reference to the FIGS. and particularly FIG. 6, the method of fabricating the first and second lighting fixtures 10 and 11 will be described in detail. First, the method includes inventorying a plurality of channel housings 12 to provide a housing inventory, inventorying a plurality of first and second circuit board devices 14 and 16 to provide respective first and second circuit board device inventories, inventorying a plurality of mounting clips 18 to provide a mounting clip inventory, and inventorying a plurality of fasteners 20 to provide a fastener inventory (Step 60).

When the workman is to assemble lighting fixtures, he or she is typically given a work order describing particular types of fixture and the number of units of each fixture to be assembled. More particularly, the workman may assemble a first predetermined number of standard single transistor type fixtures or first lighting fixtures 10 and assemble a second predetermined number of low noise "push-pull" type transistor fixtures or second lighting fixtures 11.

To begin, the workman will retrieve the particular number of components associated with each fixture to be assembled from inventory. The workman may select a number of common channel housings 12 and fasteners 20 and 25 necessary to complete the total number of fixtures set forth on the work order (Step 62). In accordance with the number of first lighting fixtures 10 to be assembled, the workman may select a first number of first circuit board devices 14, from the first circuit board device inventory (Step 64). Thereafter, the workman may select a second number of second circuit board devices 16 and mounting clips 18 from their respective inventories in accordance with the number of second lighting fixtures 11 to be assembled (Step 66).

It will be appreciated by those skilled in the art that, in practice, the assembly of the single transistor and push-pull type transistor fixtures may take place on the same assembly line with the workman selecting the components for the particular fixtures desired as they move along the assembly line. While the assembly of both may be intermingled, the operation will be described as the workman elected to first assemble the single transistor models or first lighting fixtures 10 and then assemble the "push-pull" models or second lighting fixtures 11 in sequential fashion.

In this manner, to assemble the first number of first lighting fixtures 10, the workman may position the first circuit board devices 14 on the back wall 22 of the channel housings 12 and between the side walls 24 thereof such that the fastener bore 42 of each transistor mounting foot 32 overlies the mounting bores 26 of the housings 12 (Step 68).

The workman may then insert the shafts 54 of the first number of fasteners 20 into the fastener bores 42 of the first circuit board devices 14, and through the mounting bores 26 of the channel housings 12. The expandable ends of the fastener shafts are then expanded to form the second enlarged heads 58 such that they engage the tabs 39 of the mounting foot 32 and the opposite enlarged heads 56 at the opposite ends thereof engage channel housings (Step 70). Thereafter, the workman positions a tubular spacer 78 between the circuit board 28 at the opposite end from the mounting feet 32 and the back wall 22 of the channel housings (FIG. Second fasteners 25 are then inserted through the bore of the spacers to secure that end of the respective circuit boards to the channel housing.

To assemble the second lighting fixtures 11 or "push-pull" type fixtures, the workman may position the second number of second circuit board devices 16 on the second number of selected channel housings 12 such that the respective clearance slots 34 between the two transistor mounting feet 32 overlie the respective mounting bores 26 of the second number of housings (Step 72).

The workman may then overlie the mounting clips 18 about the second circuit board devices such that the hold down plates 50 of the clips complementarily engage the pair of transistor mounting feet 32 thereof and the through bore 52 of the hold down plate 50 overlies the clearance slot 34 between the pair of mounting feet (Step 74).

The workman may then insert the shafts 54 of the second number of fasteners 20 into the through bores 52 of the mounting clips 18, through the respective the clearance slots 34 of the second circuit board devices 16, and through the mounting bores 26 of the channel housings 12. The expandable ends of the fastener shafts may then be expanded to form the second enlarged heads 58 such that they engage the hold down plates 50 of the mounting clips 18 and the opposite enlarged heads 56 thereof engage the channel housings to sandwich the pair of mounting feet 32 of the second circuit board devices 16 between the respective hold down plates of the mounting clips and the respective planar back walls 22 of the channel housings 12 (Step 76). Because the shaft 54 of the fastener 20 is received between the pair of mounting feet, the feet tend to block any lateral side-to-side movement of the circuit board on the channel housing. At the opposite end from the mounting feet 32, tubular spacers 78 may then be positioned between the respective circuit boards 28, and the back wall 22 of the channel housings 24 (FIG. 2). Second fasteners 25 are then inserted through the spacers to secure that end of the respective circuit boards to the channel housings.

It is to be appreciated the mounting clip 18 is configured to complementally cover nearly the entire top surface of the mounting feet 32 of the "push-pull" or second circuit board device 16 in a covering relationship. As such, the mounting clip applies a uniform engaging force over the mounting feet against the back wall 22 of the channel housing 12 to provide a secure tight connection. As such, when the lighting fixture is turned on, heat generated from the transistors is transferred from the bottom surfaces 40 of the transistor mounting feet to the back wall 22 of the channel housing 12. Because the fastener 20 and mounting clip 18 provide a secure tight intimate contact therebetween, heat is efficiently carried away. In addition, because the mounting clip 18 complementally engages the top surface of the transistor mounting feet 32, heat generated from the transistors may also be transferred from the upper surfaces of the respective mounting feet to the mounting clip to further carry away and dissipate heat from the transistor. As such, the mounting clip acts as an addition heat sink to absorb expended heat and may as well act as a heat fin to transfer heat to the surrounding air by convection.

Thereafter, to complete assembly of both the first and second lighting fixtures 10 and 11, wireway covers (not shown) may be positioned over the electrical components and the lateral ends thereof received in the lower grooves 29 of the respective said walls 24 of the channel housings 12. Fluorescent light tubes (not shown) may be mounted over the wireway cover and the lateral ends of a lens covers received in the upper grooves 27 of the channel of the channel housings to enclose the electrical components, wireway and fluorescent tubes. Once the respective lighting fixtures are finally assembled, the fixtures may be packaged and inventoried for subsequent shipment and sale to consumers for installation in their recreational vehicles, marine vessels, tractor trailers, and the like.

From the foregoing, it can be appreciated that the invention provides a fluorescent tube lighting fixture wherein differently configured first and second circuit board devices having either one or two integrally formed transistor mounting feet respectively may be mounted to a standard common channel housing. The second circuit board device may be mounted to the channel housing in a single assembly step utilizing a thermally conductive mounting clip. Because a single standard channel housing is used, inventory and the expenses associated with providing and storing an additional housing configured to mount the second differently configured circuit board device is minimized. Furthermore, equipment, tooling time and manufacturing expenses that would be incurred in providing the second housings are eliminated.

While a particular form of the invention has been illustrated and described, it will be apparent that various modifications can be made without departing from the spirit and scope of the invention.

What is claimed is:

1. A method of fabricating first and second fluorescent tube lighting fixtures including the steps of:

inventorying a plurality of channel housings to provide a housing inventory, each housing formed with a back wall having a planer front surface including a central mounting bore;

inventorying a plurality of first and second circuit board devices to provide respective first and second circuit board device inventories, the respective said first and second circuit board devices being of the type mounting electronics thereon to form a lighting ballast, said plurality of first circuit board devices each including a single thermally conductive transistor mounting foot projecting from one end thereof and formed with a fastener bore therethrough, said plurality of second circuit board devices each including a pair of thermally conductive laterally spaced apart transistor mounting feet projecting from the respective one ends thereof to define therebetween a clearance slot;

inventorying a plurality of thermally conductive mounting clips to provide a mounting clip inventory, each clip of the type configured with a hold down plate formed to complementally fit over the respective said transistor mounting feet of said second circuit board devices and formed with a through bore for selective alignment with the respective said clearance slots;

inventorying a plurality of fasteners to provide a fastener inventory, each of said fasteners of the type including a shaft sized for receipt within the respective said mounting bores, said fastener bores, and said through bores, said shaft having a first enlarged head at one end and an expandable opposite end defining a second enlarged head when said expandable end is expanded;

selecting a first number of said channel housings and said fasteners from the respective said housing and fastener inventories and selecting said first number of said first circuit board devices from said first circuit board inventory;

selecting a second number of said channel housings, said mounting clips, and said fasteners from said respective said housing, clip, and fastener inventories and selecting said second number of said second circuit board devices from said second circuit board inventory;

positioning said first number of first circuit board devices on said first number of selected channel housings such that the respective said fastener bores of said single transistor mounting feet overlie the respective said mounting bores;

positioning said second number of second circuit board devices on said second number of selected channel housings such that the respective said clearance slots between said pair of transistor mounting feet overlie the respective said mounting bores;

overlying said second number of said mounting clips about said second number of said second circuit board devices such that the respective said hold down plates of said clips complementally engage the respective said pair of transistor mounting feet and the respective said through bores of the respective said hold down plates overlie the respective said clearance slots thereof;

inserting the respective said shafts of said first number of said fasteners into the respective said fastener bores of said first number of first circuit board devices, and through the respective said mounting bores of said first number of channel housings and expanding the respective said expandable ends of the respective said first number of fastener shafts to form respective said second enlarged heads such that one of the respective said enlarged heads engages the respective said first number of channel housings and the other respective said enlarged head engages the single mounting foot to fasten the respective said first circuit board devices to the respective said planar back walls of said first number of channel housings; and inserting the respective said shafts of said second number of fasteners into the respective said through bores of said second number of clips, through the respective said clearance slots of said second number of second circuit board devices, and through the respective said mounting bores of said second number of channel housings and expanding the respective said expandable ends of the respective said second number of fastener shafts to form the respective said second enlarged heads such that one of the respective said enlarged heads engages the respective said second number of channel housings and the other respective said enlarged head engages the respective said hold down plates of the second number of said mounting clips to sandwich the respective said pair of transistor mounting feet of said second circuit board devices between the respective said hold down plates of said second number of clips and the respective said planar back walls of said second number of channel housings.

2. The method of fabricating first and second fluorescent tube lighting fixtures according to claim 1 that includes:

selecting a mounting clip of the type further including an orthogonally projecting retainer lip configured to overlie the respective ends of said pair of transistor mounting feet of said second circuit board devices and wherein when the respective said second number of mounting clips are overlaid about the respective said second number of second circuit boards, said respective retainers overlie the respective said ends of said pair of transistor mounting feet.

3. A method of fabricating a fluorescent tube lighting fixture including the steps of:

selecting a channel housing formed with a back wall formed with a planar front surface and including a central mounting hole;

selecting a circuit board device to be mounted to said channel housing from a set of first and second circuit board devices, said set of circuit boards of the type including an elongated planar support surface mounting electronics thereon to form a lighting ballast said first circuit board device including a longitudinally projecting thermally conductive mounting foot projecting centrally from one end thereof and formed with a fastener bore therethrough, and said second circuit board device including two of said mounting feet projecting from one end thereof and laterally spaced apart to define a clearance slot therebetween;

positioning said first circuit board device when said first circuit board device is selected in said channel housing such that said fastener bore overlies said mounting hole;

positioning said second circuit board device when said second circuit board device is selected in said channel housing such that said clearance slot overlies said mounting hole;

selecting a thermally conductive mounting clip, when said second circuit board device is selected, including a hold down plate and an orthogonally projecting retainer, said hold down plate configured to complementally fit over said feet of said second circuit board device and said retainer configured to overlie the respective ends thereof, said hold down plate being formed with a central through bore;

overlying said mounting clip, when said second circuit board device is selected, over said feet such that said hold down plate complementarily engages said feet and said retainer overlies said respective ends of said feet;

selecting a fastener of the type including a shaft having a pair of enlarged heads at the opposite ends thereof;

inserting said shaft of said fastener, when said first circuit board device is selected, into said through said fastener bore of said foot and through said mounting bore, such that one of said heads engages said channel housing and the other said head engages said foot to fasten said mounting foot to said planar back wall; and inserting said shaft of said fastener, when said second circuit board device is selected, into said through bore of said clip, through said clearance slot and through said mounting bore, such that one of said heads engages said channel housing and the other said head engages the hold down plate to sandwich said feet between said hold down plate and said planar back wall to fasten said feet therebetween.

4. A fluorescent tube lighting apparatus comprising:

a channel housing formed with a back wall having a planar front surface and including a central mounting bore;

a circuit board device of the type including a planar support surface and two laterally spaced apart thermally conductive mounting feet projecting longitudinally from one end thereof to define therebetween a clearance slot;

a thermally conductive mounting clip including a hold down plate configured to complementarily fit over the respective said feet and an orthogonally projecting retainer for overlying the respective ends of the respective said feet, said hold down plate being formed with a through bore;

a fastener including a shaft having enlarged heads at the opposite ends thereof, said shaft configured for receipt within said through bore of said clip, within said clearance slot, and within said mounting bore of said housing to mount said circuit board to said channel housing, one of said heads engaging said channel and the other said head engages the hold down plate to sandwich said respective feet between said hold down plate and said planar back wall.

5. A mounting device for mounting a circuit board device of the type including a planar support surface and two laterally spaced apart thermally conductive mounting feet having respective distal ends and respective top surfaces and projecting longitudinally from one end thereof to define therebetween a clearance slot to a fluorescent tube lighting apparatus including a channel housing formed with a back wall having a planar front surface and including a central mounting bore, said mounting device comprising;

a mounting clip formed from a metallic material and including a hold down plate configured to complementarily fit over the respective said feet and a down turned retainer lip for overlying the respective distal ends of the respective said feet, said hold down plate being formed centrally with a through bore and configured on said bottom side with a lateral groove;

a fastener including a shaft having enlarged heads at the opposite ends thereof, said shaft configured for receipt within said through bore of said clip, within said clearance slot, and within said mounting bore of said housing to mount said circuit board to said channel housing, one of said heads engaging said channel and the other said head engages the hold down plate to sandwich said respective feet between said hold down plate and said planar back wall.

6. A mounting device according to claim 5 wherein:

said mounting clip is formed integrally from an extruded thermally conductive metal.

7. A mounting device according to claim 5 wherein:

said mounting clip is further formed to project proximally to form a flat horizontal flange to overlie said top surfaces of said feet to, after said respective fastener heads engage said hold drain plate and said channel housing, apply a uniform engaging force over said mounting feet top surfaces.

* * * * *